United States Patent
Zhu et al.

(10) Patent No.: US 8,363,459 B2
(45) Date of Patent: Jan. 29, 2013

(54) MAGNETIC TUNNEL JUNCTION DEVICE AND FABRICATION

(75) Inventors: Xiaochun Zhu, San Diego, CA (US); Seung H. Kang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 576 days.

(21) Appl. No.: 12/482,730

(22) Filed: Jun. 11, 2009

(65) Prior Publication Data
US 2010/0315863 A1    Dec. 16, 2010

(51) Int. Cl.
*G11C 11/00* (2006.01)

(52) U.S. Cl. .......... 365/158; 365/48; 365/171; 365/173; 365/222; 365/225.5

(58) Field of Classification Search ................. 365/158
See application file for complete search history.

(56) References Cited

U.S. PATENT DOCUMENTS

| | | | |
|---|---|---|---|
| 2004/0233760 A1* | 11/2004 | Guo et al. | 365/222 |
| 2005/0254287 A1* | 11/2005 | Valet | 365/158 |
| 2006/0034022 A1* | 2/2006 | Fukuzawa et al. | 360/324.1 |
| 2007/0274009 A1* | 11/2007 | Hoshino et al. | 360/313 |
| 2009/0080239 A1 | 3/2009 | Nagase et al. | |

OTHER PUBLICATIONS

International Search Report and Written Opinion—PCT/US2010/038362, International Search Authority—European Patent Office—Jun. 10, 2010.

* cited by examiner

*Primary Examiner* — Jason Lappas
(74) *Attorney, Agent, or Firm* — Sam Talpalatsky; Nicholas J. Pauley; Jonathan T. Velasco

(57) ABSTRACT

A magnetic tunneling junction (MTJ) device and fabrication method is disclosed. In a particular embodiment, an apparatus is disclosed that includes an MTJ device. The MTJ device includes a free layer and a spin torque enhancing layer. The spin torque enhancing layer includes a nano-oxide layer.

52 Claims, 7 Drawing Sheets

MAGNETIC TUNNEL JUNCTION DEVICE AND FABRICATION

I. FIELD

The present disclosure is generally related to magnetic tunneling junction (MTJ) devices and fabrication.

II. DESCRIPTION OF RELATED ART

MTJ elements may be used to create a magnetic random access memory (MRAM). An MTJ element typically includes a pinned layer, a magnetic tunnel barrier, and a free layer, where a bit value is represented by a magnetic moment in the free layer. A bit value stored by an MTJ element is determined by a direction of the magnetic moment of the free layer relative to a direction of a fixed magnetic moment carried by the pinned layer. The magnetization of the pinned layer is fixed while the magnetization of the free layer may be switched.

When a current flows through the MTJ element, the magnetization direction of the free layer may be changed when the current density exceeds a threshold value, i.e., a critical switching current density ($J_c$). According to a spin-torque-transfer model, $J_c$ is proportional to an effective damping constant ($\alpha_{eff}$), a saturation magnetization ($M_S$), and a thickness ($t_{free}$) of the free layer, i.e., $J_c \propto \alpha_{eff}(M_S)^2 t_{free}$. Lowering the critical switching current density enables low power consumption and smaller chip area of STT-MRAM technologies, which may be achieved by reducing one or more of $\alpha_{eff}$, $M_S$, and $t_{free}$.

A spin barrier layer interposed between the free layer and a top electrical contact of the MTJ element may reduce the effective damping constant $\alpha_{eff}$ of the free layer. However, spin barrier layers are typically insulating layers that may include an oxide of materials, a nitride of materials, or a half-metallic layer and so typically have a high serial resistance. High serial resistance lowers the tunneling magnetoresistance (TMR) of the MTJ device, causing problems for the STT-MRAM read and write processes. High serial resistance may also limit the write driving current supply capability of the bitcell.

III. SUMMARY

A spin torque enhancing layer adjacent to a free layer of an MTJ device may include a nano-oxide layer. With the spin torque enhancing layer inserted between the free layer and the top metal contact of the MTJ device, the spin torque enhancing layer interfaces with the free layer, decreasing the effective damping constant $\alpha_{eff}$ of the free layer. Decreasing the effective damping constant $\alpha_{eff}$ of the free layer decreases the critical switching current density $J_c$ because $J_c \propto \alpha_{eff}(M_S)^2 t_{free}$. Current confined paths extending through the nano-oxide layer keep the MTJ serial resistance from increasing substantially, so the tunneling magnetoresistance (TMR) of the MTJ device does not substantially decrease.

In a particular embodiment, an apparatus is disclosed that includes an MTJ device. The MTJ device includes a free layer and a spin torque enhancing layer responsive to the free layer, the spin torque enhancing layer including a nano-oxide layer.

In another particular embodiment, an apparatus is disclosed that includes an MTJ device. The MTJ device includes a free layer, a tunnel barrier layer adjacent to the free layer, and a spin torque enhancing layer adjacent to the free layer. The spin torque enhancing layer includes a nano-oxide layer. The spin torque enhancing layer is between the free layer and an electrical contact of the MTJ device.

In another particular embodiment, an apparatus is disclosed that includes an MTJ device including means for storing a data value as an orientation of a magnetic moment that is programmable by a spin polarized current exceeding a threshold current density. The MTJ device also includes tunneling barrier means for providing conduction electrons to the means for storing by quantum mechanical tunneling of conduction electrons through a barrier. The MTJ device further includes spin torque enhancing means for reducing a critical switching current density threshold without substantially decreasing a tunneling magnetoresistance (TMR) of the magnetic tunnel junction device. The spin torque enhancing means includes a nano-oxide layer, and the means for storing is positioned between the tunneling barrier means and the spin torque enhancing means.

In another particular embodiment, a method is disclosed that includes forming a free layer above a tunnel barrier layer of a magnetic tunneling junction (MTJ) structure. The method includes forming a spin torque enhancing layer above the free layer. The spin torque enhancing layer includes a nano-oxide layer.

One particular advantage provided by at least one of the disclosed embodiments is to reduce a critical switching current density $J_c \propto \alpha_{eff}(M_S)^2 t_{free}$ by reducing an effective damping constant $\alpha_{eff}$ of a free layer as compared to MTJ devices that do not include a spin torque enhancing layer including a nano-oxide layer. Another particular advantage provided by at least one of the disclosed embodiments is an MTJ structure that does not increase an MTJ serial resistance and does not decrease a tunneling magnetoresistance (TMR) of the MTJ device as compared to MTJ devices that do not use a spin torque enhancing layer including a nano-oxide layer. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
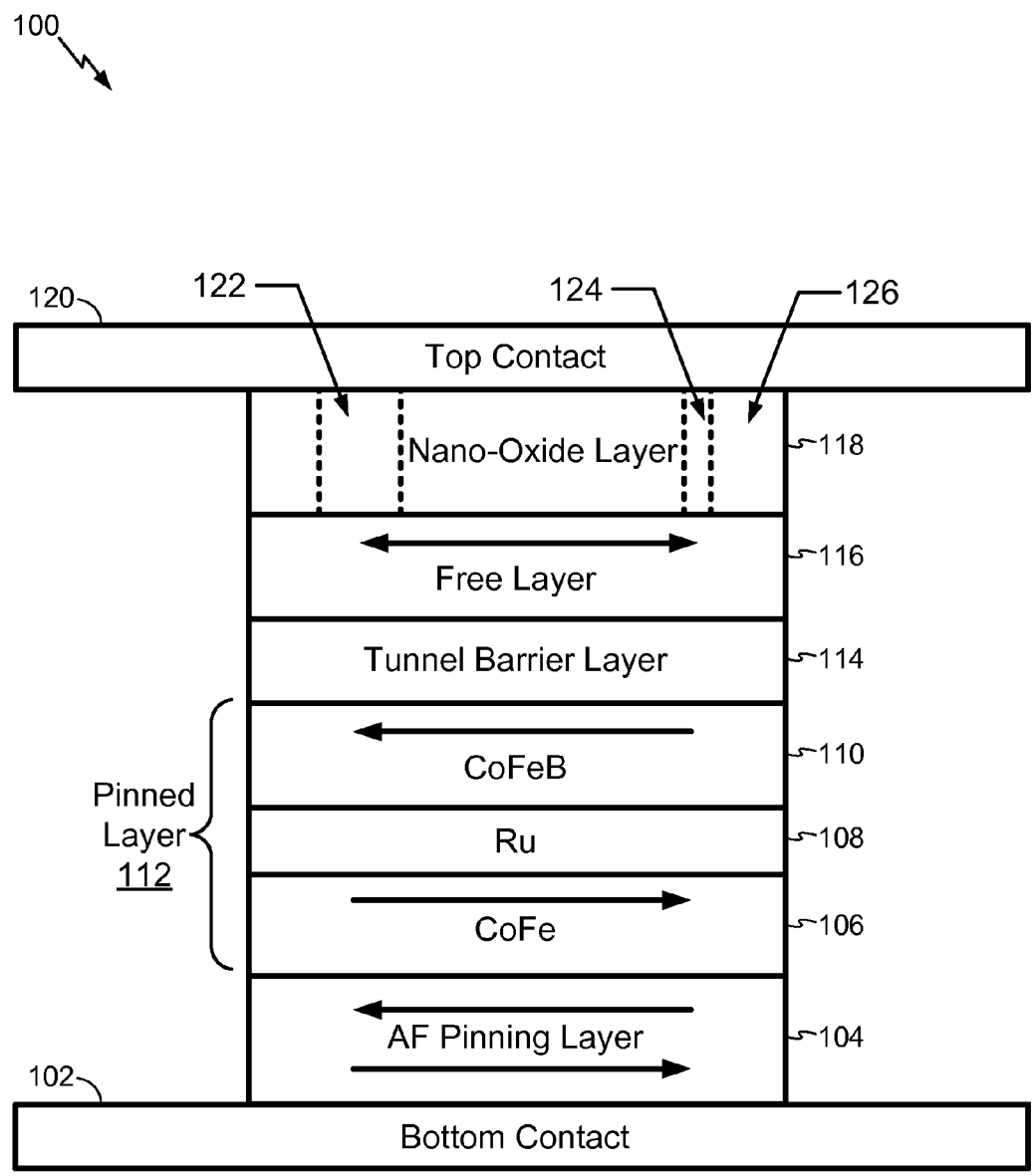
FIG. 1 is a first illustrative embodiment of a magnetic tunneling junction (MTJ) device with a spin torque enhancing layer including a nano-oxide layer.

Referring to FIG. 1, a first illustrative embodiment of a magnetic tunneling junction (MTJ) device with a spin torque enhancing layer including a nano-oxide layer is depicted and generally designated 100. The MTJ device 100 includes a bottom contact 102, an anti-ferromagnetic (AF) pinning layer 104, a pinned layer 112, a tunnel barrier layer 114, a free layer 116, a spin torque enhancing layer including a nano-oxide layer 118, and a top contact 120. In a particular embodiment, the pinned layer 112 is a composite layer and includes a CoFe ferromagnetic layer 106, an Ru non-magnetic layer 108, and a CoFeB ferromagnetic layer 110.

The spin torque enhancing layer including the nano-oxide layer 118 may include one or more conductive islands 122 of conductive material extending therethrough connecting the free layer 116 and the top contact 120. The spin torque enhancing layer including the nano-oxide layer 118 may also have one or more conductive paths 124 of conductive material extending therethrough also connecting the free layer 116 and the top contact 120. The one or more conductive islands 122 and the one or more conductive paths 124 may be surrounded by insulating material 126.

In a particular embodiment, the spin torque enhancing layer including the nano-oxide layer 118 reduces a critical switching current density threshold without substantially decreasing a tunneling magnetoresistance (TMR) of the MTJ device 100. In a particular embodiment, the tunneling magnetoresistance (TMR) is a ratio of a difference between a first resistance ($R_1$) in a first state of the MTJ device 100 and a second resistance ($R_0$) in a second state of the MTJ device 100 to the second resistance ($R_0$) in the second state of the MTJ device 100. For example, $$TMR = \frac{R_1 - R_0}{R_0}.$$

In a particular embodiment, the spin torque enhancing layer including the nano-oxide layer 118 reduces a critical switching current density threshold without substantially increasing a resistance of the MTJ device 100. The spin torque enhancing layer including the nano-oxide layer 118 may be responsive to the free layer 116 by reducing the effective damping constant $\alpha_{eff}$ of the free layer 116, to reduce the critical switching current density threshold $J_c$ because $J_c \propto \alpha_{eff} (M_s)^2 t_{free}$.

In a particular embodiment, the spin torque enhancing layer including the nano-oxide layer 118 includes an oxidation layer of a non-magnetic metal alloy. For example, the spin torque enhancing layer including the nano-oxide layer 118 may be formed by oxidizing a non-magnetic alloy. For example, a non-magnetic metal aluminum copper $Al_{90}Cu_{10}$ alloy may be deposited on the free layer 116 and oxidized to form an aluminum oxide $Al_2O_3$ insulating material 126, with the unoxidized metal of the $Al_{90}Cu_{10}$ forming the one or more conductive islands 122 and the one or more conductive paths 124. The thickness of the non-magnetic metal aluminum copper $Al_{90}Cu_{10}$ alloy may be changed to control the number and the density of the one or more conductive islands 122 and the one or more conductive paths 124.

The insulating material 126 may include an oxide of materials from a group consisting of Mg, Al, B, Si, Ge, W, Nb, Mo, Ta, V, Ti, Cr, Fe, Co, Ni, and Cu. The insulating material 126 may also include a nitride of materials from a group consisting of Al, B, Si, Ge, Ti, and Pt. The insulating material 126 may also include at least one material from the group consisting of Si, Ge, Ga, Cd, Te, Sb, In, Al, As, Hg, C, and Cr. The insulating material 126 may also include half-metallic materials, such as $Sr_2FeMoO_6$, $(La_{0.7}Sr_{0.3})MnO_3$, NiMnSb, $Fe_3O_4$, and $CrO_2$. The one or more conductive islands 122 and the one or more conductive paths 124 may include one or more materials from a group consisting of Cu, Ag, Au, Pt, Pd, Ir, Os, Cr, Ta, Mg, Ti, Si, Al, Ni, Fe, and Co.

Figure 2:
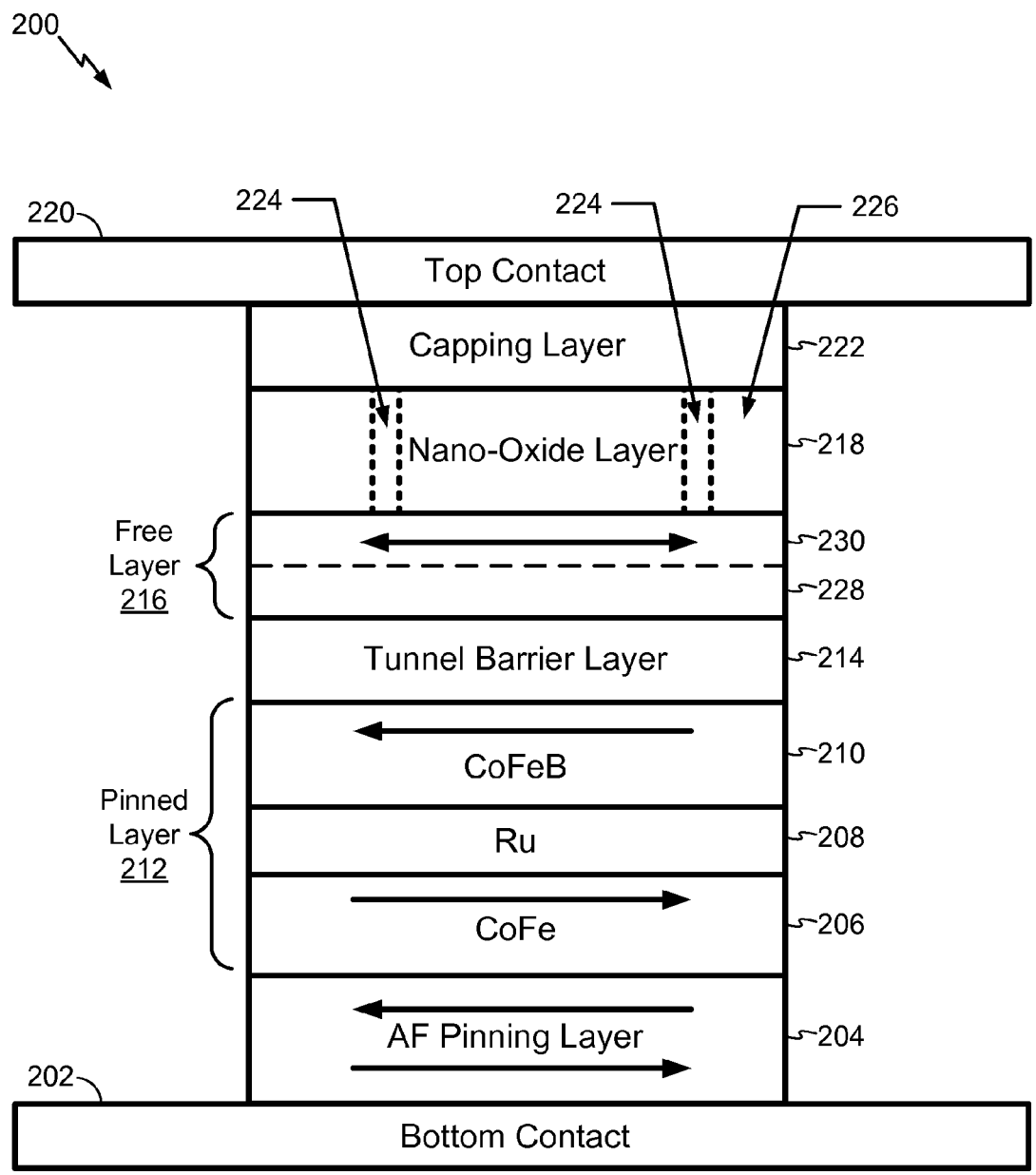
FIG. 2 is a second illustrative embodiment of a magnetic tunneling junction (MTJ) device with a spin torque enhancing layer including a nano-oxide layer.

Referring to FIG. 2, a second illustrative embodiment of a magnetic tunneling junction (MTJ) device with a spin torque enhancing layer including a nano-oxide layer is depicted and generally designated 200. The MTJ device 200 may be similar to the MTJ device 100 of FIG. 1. The MTJ device 200 includes a bottom contact 202, an anti-ferromagnetic (AF) pinning layer 204, a pinned layer 212, a tunnel barrier layer 214, a free layer 216, a spin torque enhancing layer including a nano-oxide layer 218, a capping layer 222, and a top contact 220. In a particular embodiment, the pinned layer 212 is a composite layer and includes a CoFe ferromagnetic layer 206, an Ru non-magnetic layer 208, and a CoFeB ferromagnetic layer 210. In a particular embodiment, the free layer 216 is a composite layer and includes a first ferromagnetic layer 228, such as CoFeB, and a second ferromagnetic layer 230, such as NiFe.

The spin torque enhancing layer including the nano-oxide layer 218 may be similar to the spin torque enhancing layer including the nano-oxide layer 118 of FIG. 1. The spin torque enhancing layer including the nano-oxide layer 218 may have one or more conductive islands of conductive material, similar to the one or more conductive islands 122 of FIG. 1, extending therethrough connecting the free layer 216 and the capping layer 222. The spin torque enhancing layer including the nano-oxide layer 218 may also have one or more conductive paths 224 of conductive material extending therethrough also connecting the free layer 216 and the capping layer 222. The one or more conductive islands and the one or more conductive paths 224 may be surrounded by insulating material 226.

In a particular embodiment, the spin torque enhancing layer including the nano-oxide layer 218 reduces a critical switching current density threshold without substantially decreasing a tunneling magnetoresistance (TMR) of the MTJ device 200. In a particular embodiment, the spin torque enhancing layer including the nano-oxide layer 218 reduces a critical switching current density threshold without substantially increasing a resistance of the MTJ device 200.

Figure 3:
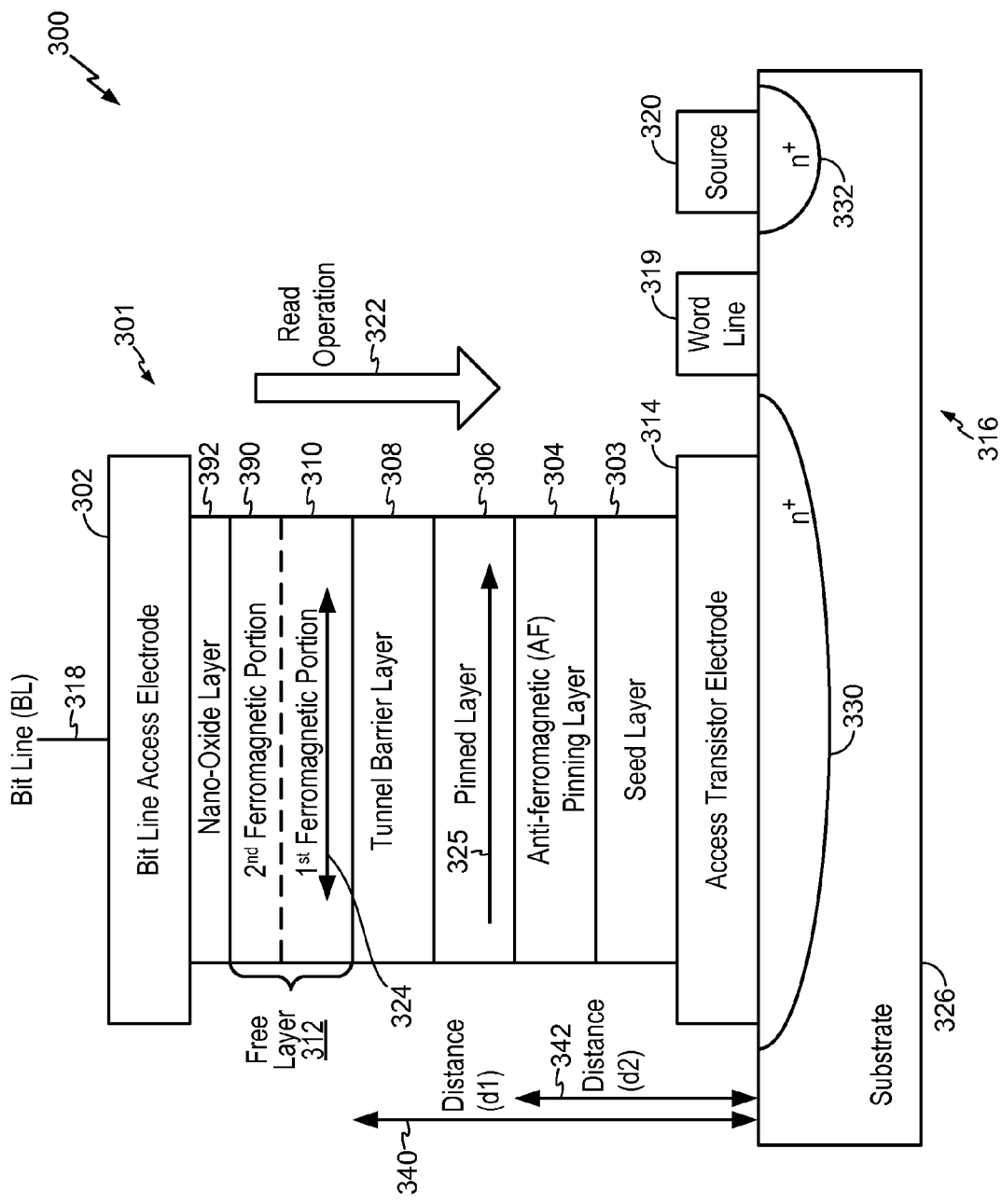
FIG. 3 is an illustrative embodiment of an element of a spin-torque-transfer magnetic random access memory (STT-MRAM) including a magnetic tunneling junction (MTJ) device with a spin torque enhancing layer that includes a nano-oxide layer.

Referring to FIG. 3, a first illustrative embodiment of an element of a spin-torque-transfer magnetic random access memory (STT-MRAM) is depicted and generally designated 300. The element of the STT-MRAM 300 includes a memory cell having a magnetic tunneling junction (MTJ) device 301 and an access transistor 316 on a substrate 326. The MTJ device 301 includes an access transistor electrode 314, a seed layer 303, an anti-ferromagnetic (AF) pinning layer 304, a pinned layer 306, a tunnel barrier layer 308, a free layer 312, a nano-oxide layer 392, and a bit line access electrode 302 coupled to a bit line 318. In a particular embodiment, the free layer 312 is a composite layer that includes a first ferromagnetic portion 310 and a second ferromagnetic portion 390. The access transistor electrode 314 is coupled to a drain region 330 of the access transistor 316. The access transistor 316 is gated by a word line 319 and has a source region 332 coupled to a source contact 320.

The seed layer 303 is in contact with the access transistor electrode 314. The seed layer 303 provides a surface for MTJ film deposition and can be composed of several different layers. The AF pinning layer 304 is in contact with the seed layer 303. The AF pinning layer 304 causes an orientation of a magnetic moment 325 of the pinned layer 306 to be pinned in a particular direction. The pinned layer 306 is in contact with the AF pinning layer 304 and may be composed of a ferromagnetic material.

The tunnel barrier layer 308 is in contact with the pinned layer 306 and physically isolates the pinned layer 306 from the free layer 312 while enabling current flow via electrons quantum mechanically tunneling across the tunnel barrier layer 308. The tunnel barrier layer 308 may be composed of a non-magnetic material. In an illustrative embodiment, the tunnel barrier layer 308 includes magnesium oxide (MgO).

The free layer 312 is in contact with the tunnel barrier layer 308 and is located at a distance d1 340 from the substrate 326. The free layer 312 has a magnetic moment 324 that may be in a parallel or antiparallel alignment with the magnetic moment 325 of the pinned layer 306. The pinned layer 306 may be at a distance d2 342 from the substrate 326 where the distance d2 342 is less than the distance d1 340. The free layer 312 is above the pinned layer 306 relative to the substrate 326. The magnetic moment 324 of the free layer 312 may be written by a current exceeding a critical switching current and may be read using a current that is less than the critical switching current. For example, the read current may be much less than the critical switching current to prevent read disturbances. In an illustrative embodiment, the free layer 312 is a single ferromagnetic layer. In another illustrative embodiment, the free layer 312 is a composite layer of two ferromagnetic layers. In a particular embodiment, the two ferromagnetic layers may sandwich a non-magnetic spacer (not shown). In another illustrative embodiment, the free layer 312 is a synthetic ferromagnetic layer or a synthetic antiferromagnetic layer.

In a particular embodiment, the free layer 312 is a composite layer that includes the first ferromagnetic portion 310 and the second ferromagnetic portion 390. In a particular embodiment, the first ferromagnetic portion 310 includes cobalt and iron. For example, the first ferromagnetic portion 310 may include CoFe, CoFe—X (such as CoFeB), CoFe—X—Y, or any combination thereof In a particular embodiment, the second ferromagnetic portion 390 includes nickel and iron. For example, the second ferromagnetic portion 390 may include NiFe, permalloy, or any combination thereof.

The nano-oxide layer 392 is in contact with the free layer 312. In a particular embodiment, the nano-oxide layer 392 includes an oxidation layer of a non-magnetic metal alloy. For example, the non-magnetic metal alloy aluminum copper $Al_{90}Cu_{10}$ may be deposited on the free layer 312 and oxidized to form the nano-oxide layer 392. The nano-oxide layer 392 may be configured to decrease the critical switching current density $J_c \propto \alpha_{eff}(M_S)^2 t_{free}$, by decreasing the effective damping constant $\alpha_{eff}$ of the free layer 312, without substantially increasing the resistance of the MTJ device 301. Because the resistance of the MTJ device 301 does not substantially increase, the tunneling magnetoresistance (TMR) of the MTJ device 301 does not substantially decrease. For example, using $$TMR = \frac{R_1 - R_0}{R_0},$$

an increase in the resistance ΔR of the MTJ device 301 would cause the TMR of the MTJ device 301 to decrease because $$TMR_{\Delta R} = \frac{(R_1 + \Delta R) - (R_0 + \Delta R)}{(R_0 + \Delta R)} = \frac{R_1 - R_0}{R_0 + \Delta R} < \frac{R_1 - R_0}{R_0} = TMR.$$

The nano-oxide layer 392 decreases the critical switching current density $J_c \propto \alpha_{eff}(M_S)^2 t_{free}$ without substantially decreasing the TMR of the MTJ device 301. Smaller critical switching current density $J_c$ can enable smaller devices, higher density memory arrays, lower power operation, higher clocking frequency, or any combination thereof.

The direction in which a write current is passed through the MTJ device 301 determines whether the magnetic moment 324 of the free layer 312 is aligned to be parallel or anti-parallel to the magnetic moment 325 of the pinned layer 306. In an illustrative embodiment, a data "1" value may be stored by passing a first write current from the bit line access electrode 302 to the access transistor electrode 314 to align the magnetic moment 324 anti-parallel to the magnetic moment 325. A data "0" value may be stored by passing a second write current from the access transistor electrode 314 to the bit line access electrode 302 to align the magnetic moment 324 parallel to the magnetic moment 325.

When a read operation 322 is performed at the STT-MRAM 300, a read current may flow from the bit line access electrode 302 to the source 320 or the read current may flow from the source 320 to the bit line access electrode 302. In a particular embodiment, a direction of the read current may be determined based on which direction provides the largest read signal. In a particular embodiment, when the read operation 322 is performed on the element of the STT-MRAM 300, a read current flows through the bit line (BL) 318, in a direction from the bitline access electrode 302 to the access transistor electrode 314. The read current through the MTJ device 301 encounters a resistance corresponding to a relative orientation of the magnetic moment 325 and the magnetic moment 324. When the magnetic moment 325 of the pinned layer 306 has a parallel orientation to the magnetic moment 324 of the free layer 312, the read current encounters a resistance different than when the magnetic moment 325 of the pinned layer 306 has an anti-parallel orientation to the magnetic moment 324 of the free layer 312. Generally, when the magnetic moment 325 of the pinned layer 306 has a parallel orientation to the magnetic moment 324 of the free layer 312, the read current encounters a lower resistance than when the magnetic moment 325 of the pinned layer 306 has an anti-parallel orientation to the magnetic moment 324 of the free layer 312.

The bitcell may therefore be used as an element of a memory device, such as an STT-MRAM 300. By employing an appropriate nano-oxide layer 392, the effective damping constant $\alpha_{eff}$ of the free layer 312 may be substantially reduced, decreasing a critical switching current density $J_c \propto \alpha_{eff}(M_S)^2 t_{free}$. Employing the nano-oxide layer 392 may decrease the critical switching current density $J_c \propto \alpha_{eff}(M_S)^2 t_{free}$ without substantially increasing the resistance of the MTJ device 301. Because the resistance of the MTJ device 301 does not substantially increase, the tunneling magnetoresistance (TMR) of the MTJ device 301 does not substantially decrease. Lower power operation and less heat generation may result from decreasing the critical switching current density $J_c$ without substantially decreasing the tunneling magnetoresistance (TMR) of the MTJ device 301, and operation using shorter write pulse lengths and higher clock frequency may also be enabled.

Figure 4:
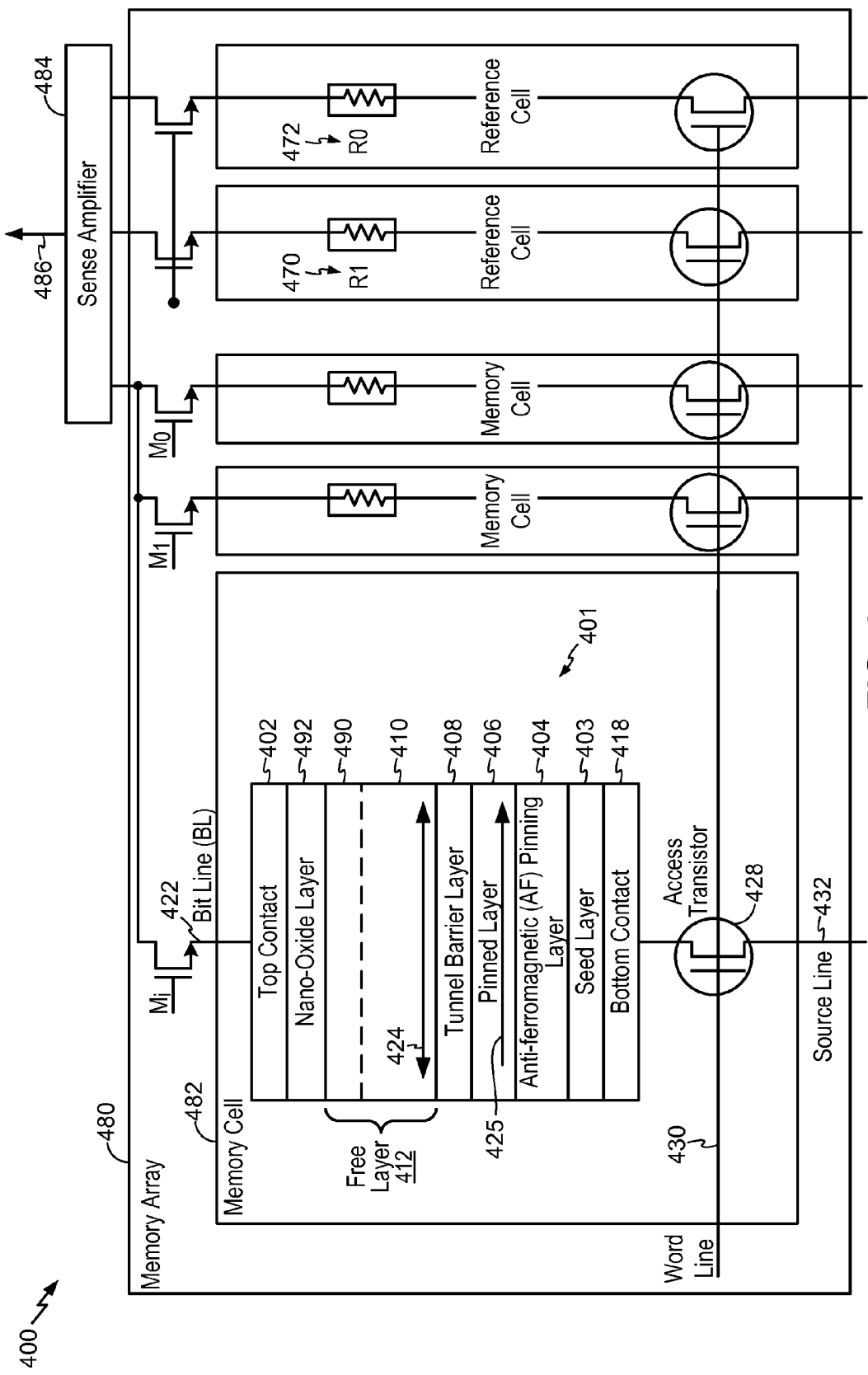
FIG. 4 is an illustrative embodiment of a memory array including a magnetic tunneling junction (MTJ) structure with a spin torque enhancing layer including a nano-oxide layer.

Referring to FIG. 4, an illustrative embodiment of a memory system is depicted and generally designated 400. The memory system 400 includes a memory array 480, such as an STT-MRAM memory array, that includes multiple memory cells, including a representative memory cell 482 and a representative pair of reference cells that store a logical high value R₁ 470 and a logical low value R₀ 472. A sense amplifier 484 is coupled to receive an output from a selected memory cell in addition to receiving outputs from the reference cells. The sense amplifier 484 is configured to produce an amplifier output 486 that indicates a value stored at the selected memory cell.

The memory cell 482 includes an MTJ structure 401 coupled to an access transistor 428. The MTJ structure 401 includes a top contact 402, a nano-oxide layer 492, a free layer 412 having a magnetic moment 424, a tunnel barrier layer 408, a pinned layer 406 having a pinned magnetic moment 425, an anti-ferromagnetic (AF) pinning layer 404, a seed layer 403, and a bottom contact 418. The access transistor 428 is coupled to the bottom contact 418 and coupled to a word line 430 and a source line 432.

The top contact 402 provides a first electrical contact to a bit line 422. The AF pinning layer 404 fixes an orientation of the magnetic moment 425 of the pinned layer 406. The pinned layer 406 may be a synthetic antiferromagnetic pinned layer including multiple layers, and may be similar to the pinned layer 112 of FIG. 1 or the pinned layer 212 of FIG. 2. The tunnel barrier layer 408 may restrict free electron access but enables a tunneling current to the free layer 412. The free layer 412 may store a data value as an orientation of the magnetic moment 424 that is programmable by application of a spin polarized current that exceeds a critical switching current. The free layer 412 is positioned between the tunnel barrier layer 408 and the nano-oxide layer 492. The nano-oxide layer 492 is positioned between the free layer 412 and the top contact 402 of the MTJ structure 401.

In a particular embodiment, the free layer 412 is a composite layer that includes a first ferromagnetic portion 410 and a second ferromagnetic portion 490. In a particular embodiment, the first ferromagnetic portion 410 includes cobalt and iron. For example, the first ferromagnetic portion 410 may include CoFe, CoFe—X (such as CoFeB), CoFe—X—Y, or any combination thereof In a particular embodiment, the second ferromagnetic portion 490 includes nickel and iron. For example, the second ferromagnetic portion 490 may include NiFe, permalloy, or any combination thereof.

The nano-oxide layer 492 may decrease the critical switching current density $J_c$ of the MTJ structure 401 without substantially decreasing the tunneling magnetoresistance (TMR) of the MTJ structure 401 in a manner substantially similar to the nano-oxide layer 392 of FIG. 3. The nano-oxide layer 492 may decrease the critical switching current density $J_c \propto \alpha_{eff} (M_S)^2 t_{free}$ without substantially increasing a resistance of the MTJ structure 401 in a manner substantially similar to the nano-oxide layer 392 of FIG. 3.

The memory array 480 depicted in FIG. 4 may include multiple cells substantially similar to the representative memory cell 482. The memory array 480, or any other array of cells using the MTJ device 100 of FIG. 1, the MTJ device 200 of FIG. 2, the MTJ device 301 of FIG. 3, or the MTJ structure 401 of FIG. 4, may be implemented in an embedded memory, such as a level two (L2) cache or another type of embedded memory, as an illustrative example. Such an array of MTJ cells may be implemented as a STT-MRAM memory to replace memory arrays that use static random access memory (SRAM), dynamic random access memory (DRAM) or flash memory technologies, for example.

Figure 5:
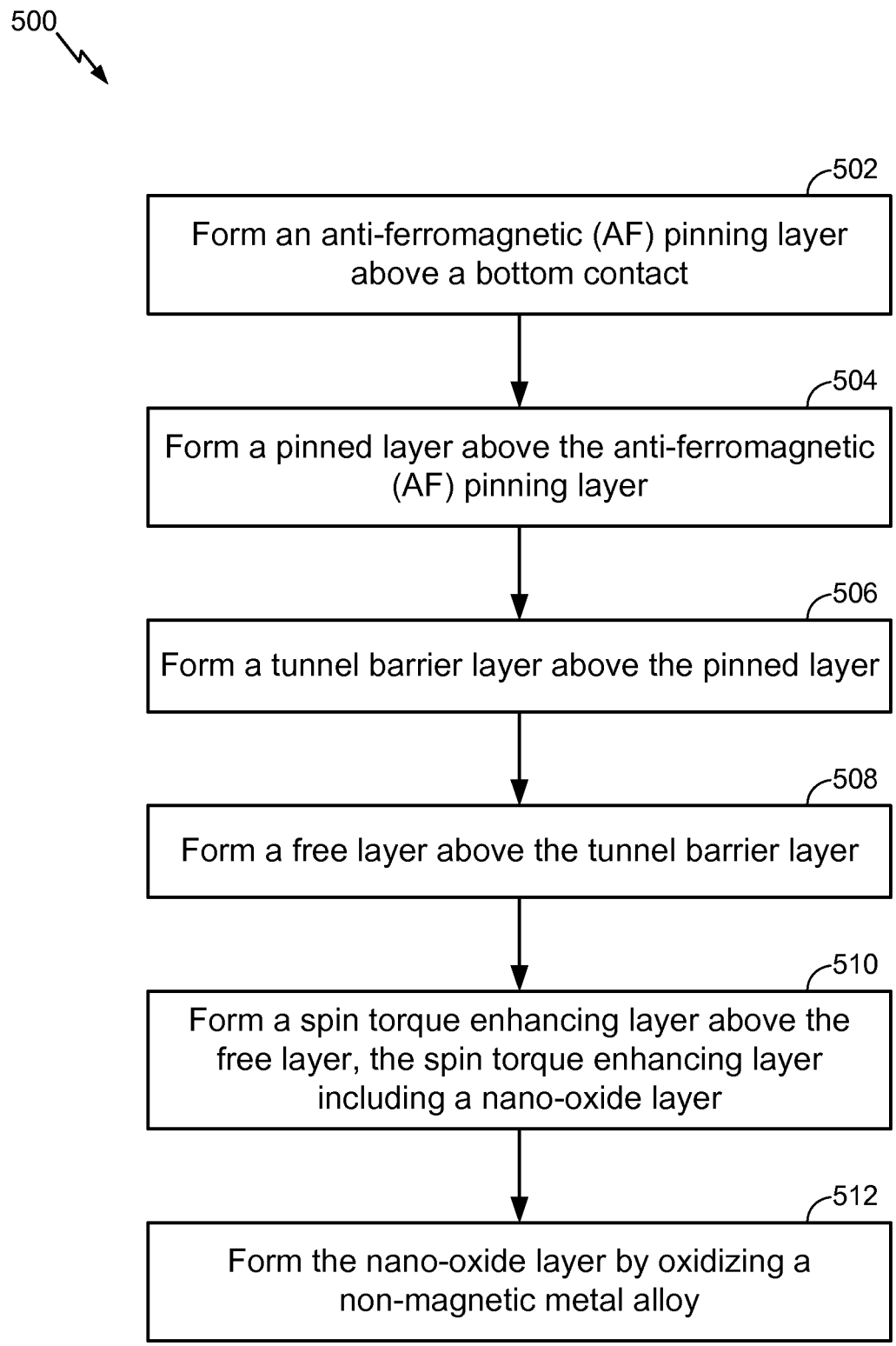
FIG. 5 is a flow diagram of an illustrative embodiment of a method of forming a magnetic tunneling junction (MTJ) device.

FIG. 5 is a flow diagram of an illustrative embodiment 500 of a method of forming a magnetic tunneling junction (MTJ) device. In the illustrative embodiment 500, the MTJ device may be the MTJ device 100 of FIG. 1, the MTJ device 200 of FIG. 2, the MTJ device 301 of FIG. 3, or the MTJ structure 401 of FIG. 4. In the illustrative embodiment 500, the method includes forming a magnetic tunneling junction by forming an anti-ferromagnetic (AF) pinning layer above a bottom contact, at 502, forming a pinned layer above the anti-ferromagnetic (AF) pinning layer, at 504, forming a tunnel barrier layer above the pinned layer, at 506, and forming a free layer above the tunnel barrier layer, at 508.

Moving to 510, a spin torque enhancing layer is formed above the free layer, the spin torque enhancing layer including a nano-oxide layer. For example, the spin torque enhancing layer including the nano-oxide layer 118 of FIG. 1 may be formed above the free layer 116 of FIG. 1. Similarly, the spin torque enhancing layer including the nano-oxide layer 218 of FIG. 2 may be formed above the free layer 216 of FIG. 2. Likewise, the nano-oxide layer 392 of FIG. 3 may be formed above the free layer 312 of FIG. 3. Similarly, the nano-oxide layer 492 of FIG. 4 may be formed above the free layer 412 of FIG. 4.

Continuing to 512, the nano-oxide layer may be formed by oxidizing a non-magnetic metal alloy. For example, a non-magnetic metal alloy aluminum copper $Al_{90}Cu_{10}$ may be deposited on the free layer 116 of FIG. 1 and oxidized to form an aluminum oxide $Al_2O_3$ insulating material 126 of FIG. 1, with the unoxidized metal of the alloy forming the one or more conductive islands 122 of FIG. 1 and the one or more conductive paths 124 of FIG. 1. For another example, a non-magnetic metal Mg may be deposited on the free layer 116 of FIG. 1 and partially oxidized to form a magnesium oxide MgO insulating material 126 of FIG. 1, with the unoxidized metal of Mg forming the one or more conductive islands 122 of FIG. 1 and the one or more conductive paths 124 of FIG. 1.

The depositing and forming of the materials and the layers may be controlled by a processor integrated into an electronic device. For example, the electronic device may be a computer configured to control fabrication machinery.

In other embodiments, the method of FIG. 5 may be performed in an order that is different than depicted. For example, the spin torque enhancing layer including the nano-oxide layer may be formed prior to formation of the free layer. In an alternative embodiment, the MTJ device that is formed may have a reversed structure than depicted in FIG. 3, with the nano-oxide layer closer to the substrate than the free layer and with the free layer closer to the bit line than the nano-oxide layer.

Figure 6:
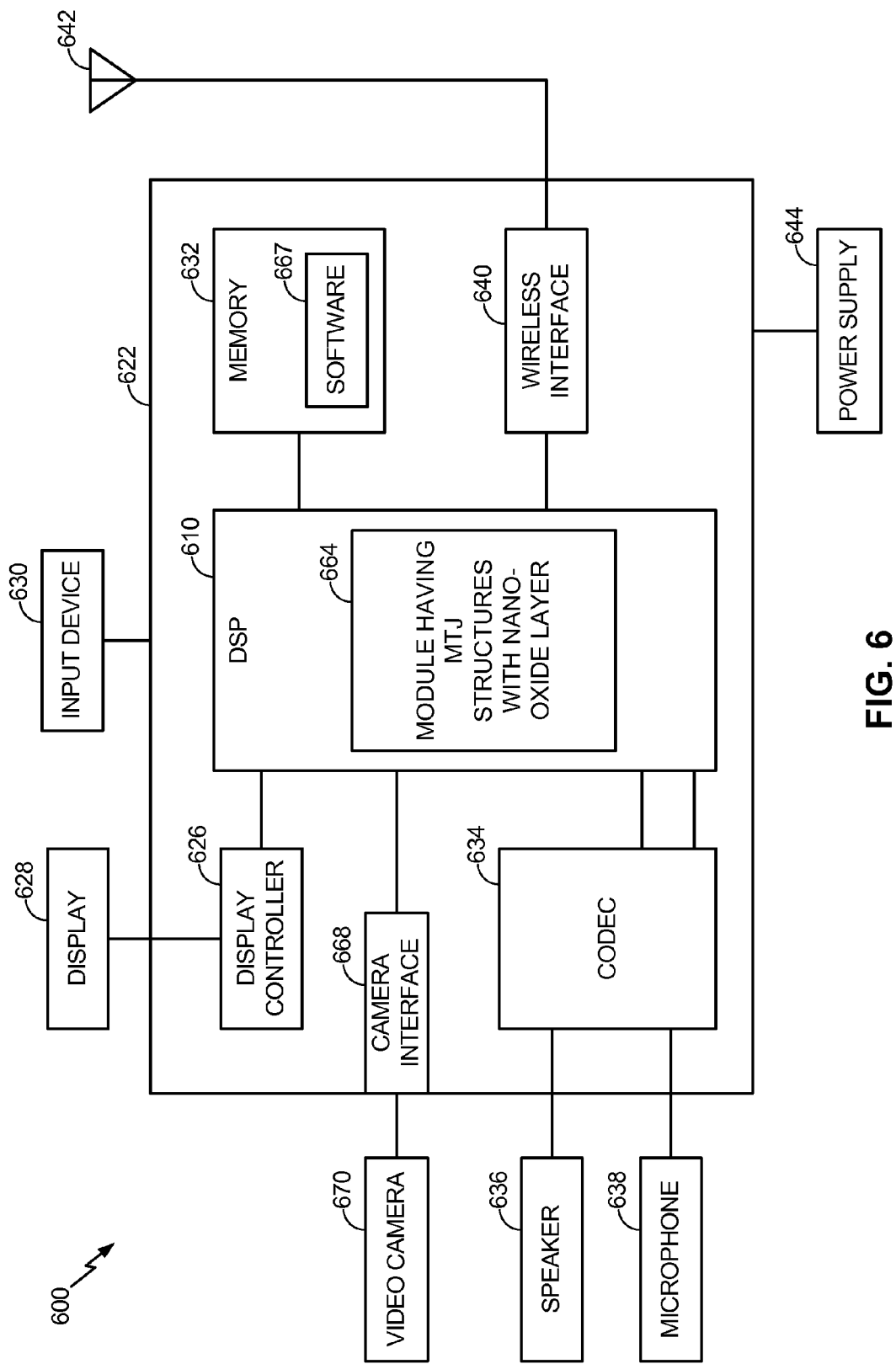
FIG. 6 is a block diagram of a particular embodiment of a portable communication device including a module having MTJ structures that include a spin torque enhancing layer including a nano-oxide layer.

FIG. 6 is a block diagram of particular embodiment of a system 600 including a module having MTJ structures that each include a nano-oxide layer 664. The system 600 may be implemented in a portable electronic device and includes a processor 610, such as a digital signal processor (DSP), coupled to computer readable medium, such as a memory 632, storing computer readable instructions, such as software 667. The system 600 includes the module having MTJ structures with a nano-oxide layer 664. In an illustrative example, the module having MTJ structures 664 includes any of the MTJ structures of FIGS. 1-4, produced in accordance with any of the embodiments of FIG. 5 or FIG. 7, or any combination thereof. The module having MTJ structures 664 may be in the processor 610 or may be a separate device or circuitry (not shown). In a particular embodiment, as shown in FIG. 6, the module having MTJ structures 664 is accessible to the digital signal processor (DSP) 610. In another particular embodiment, the memory 632 may include an STT-MRAM memory array that includes the module having MTJ structures 664.

A camera interface 668 is coupled to the processor 610 and also coupled to a camera, such as a video camera 670. A display controller 626 is coupled to the processor 610 and to a display device 628. A coder/decoder (CODEC) 634 can also be coupled to the processor 610. A speaker 636 and a microphone 638 can be coupled to the CODEC 634. A wireless interface 640 can be coupled to the processor 610 and to a wireless antenna 642.

In a particular embodiment, the processor 610, the display controller 626, the memory 632, the CODEC 634, the wireless interface 640, and the camera interface 668 are included in a system-in-package or system-on-chip device 622. In a particular embodiment, an input device 630 and a power supply 644 are coupled to the system-on-chip device 622. Moreover, in a particular embodiment, as illustrated in FIG. 6, the display device 628, the input device 630, the speaker 636, the microphone 638, the wireless antenna 642, the video camera 670, and the power supply 644 are external to the system-on-chip device 622. However, each of the display device 628, the input device 630, the speaker 636, the microphone 638, the wireless antenna 642, the video camera 670, and the power supply 644 can be coupled to a component of the system-on-chip device 622, such as an interface or a controller.

Figure 7:
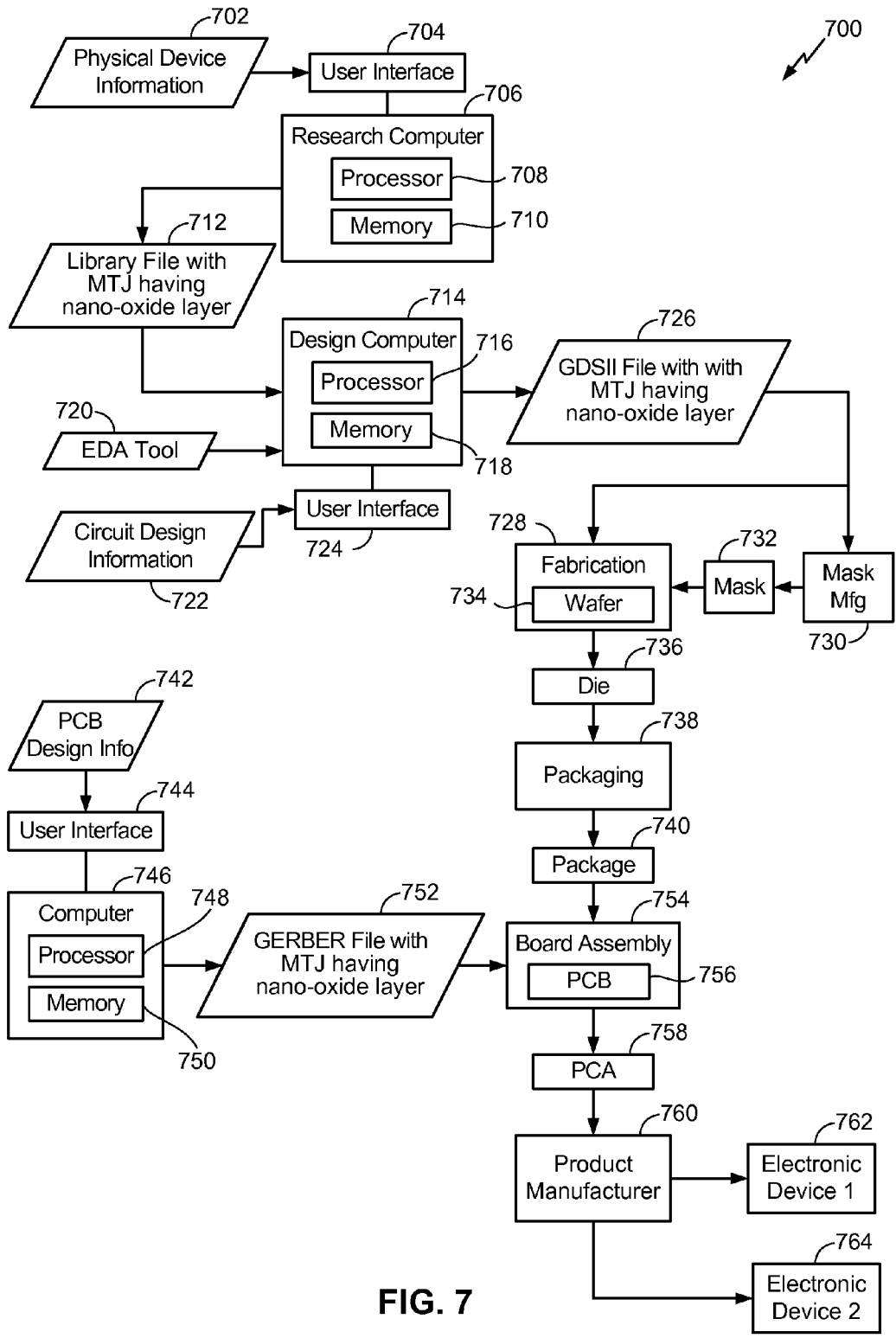
FIG. 7 is a data flow diagram illustrating a manufacturing process for use with magnetic tunneling junction (MTJ) devices having a spin torque enhancing layer as described in FIGS. 1-6.

The foregoing disclosed devices and functionalities (such as the devices of FIG. 1, FIG. 2, FIG. 3 or FIG. 4, the method of FIG. 5, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 7 depicts a particular illustrative embodiment of an electronic device manufacturing process 700.

Physical device information 702 is received in the manufacturing process 700, such as at a research computer 706. The physical device information 702 may include design information representing at least one physical property of a semiconductor device, such as the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit using the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof, in addition to other circuits or information. To illustrate, the data file may include information corresponding to a system-on-chip (SOC) that includes the memory array 480 of FIG. 4 and that also includes additional electronic circuits and components within the SOC.

The GDSII file 726 may be received at a fabrication process 728 to manufacture the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof, according to transformed information in the GDSII file 726. For example, a device manufacture process may include providing the GDSII file 726 to a mask manufacturer 730 to create one or more masks, such as masks to be used for photolithography processing, illustrated as a representative mask 732. The mask 732 may be used during the fabrication process to generate one or more wafers 734, which may be tested and separated into dies, such as a representative die 736. The die 736 includes a circuit including the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines for performing various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to the teachings of the disclosure, the disclosure is not limited to these exemplary illustrated units. Embodiments of the disclosure may be suitably employed in any device which includes active integrated circuitry including memory and on-chip circuitry.

Thus, the MTJ device 100 of FIG. 1, the MTJ device 200 of FIG. 2, the MTJ device 301 of FIG. 3, the memory array 480 of FIG. 4, the memory cell 482 of FIG. 4, the MTJ structure 401 of FIG. 4, or any combination thereof, may be fabricated, processed, and incorporated into an electronic device, as described in the illustrative process 700. One or more aspects of the embodiments disclosed with respect to FIGS. 1-5 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof For example, the GDSII file 726 or the fabrication process 728 can include a computer readable tangible medium storing instructions executable by a computer, the instructions including instructions that are executable by the computer to initiate formation of a free layer above a tunnel barrier layer of a magnetic tunneling junction structure and instructions that are executable by the computer to initiate formation of a spin torque enhancing layer above the free layer, the spin torque enhancing layer including a nano-oxide layer. Although various representative stages of production from a physical device design to a final product are depicted, in other embodiments fewer stages may be used or additional stages may be included. Similarly, the process 700 may be performed by a single entity, or by one or more entities performing various stages of the process 700.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a magnetic tunneling junction device comprising:
a free layer;
a spin torque enhancing layer responsive to the free layer, wherein the spin torque enhancing layer comprises a non-magnetic metal alloy and a nano-oxide layer; and
a capping layer adjacent to the spin torque enhancing layer.

2. The apparatus of claim 1, wherein the nano-oxide layer includes an oxidation layer of a non-magnetic metal alloy.

3. The apparatus of claim 1, wherein the free layer is a single layer.

4. The apparatus of claim 1, wherein the free layer is a composite layer of two ferromagnetic layers.

5. The apparatus of claim 1, wherein the free layer is a composite layer of two ferromagnetic layers sandwiching a non-magnetic spacer layer.

6. The apparatus of claim 1, wherein the free layer is a synthetic antiferromagnetic layer.

7. The apparatus of claim 1, wherein the free layer is a synthetic ferromagnetic layer.

8. The apparatus of claim 1, wherein the spin torque enhancing layer including the nano-oxide layer includes one or more conductive islands of conductive material extending therethrough and one or more conductive paths of conductive material extending therethrough, the one or more conductive islands and the one or more conductive paths surrounded by insulating material.

9. The apparatus of claim 1, wherein the spin torque enhancing layer reduces a critical switching current density threshold without substantially decreasing a tunneling magnetoresistance (TMR) of the magnetic tunneling junction device.

10. The apparatus of claim 9, wherein the tunneling magnetoresistance (TMR) is a ratio of a difference between a first resistance in a first state of the magnetic tunneling junction device and a second resistance in a second state of the magnetic tunneling junction device to the second resistance in the second state of the magnetic tunneling junction device.

11. The apparatus of claim 1, further comprising a tunnel barrier layer adjacent to the free layer.

12. The apparatus of claim 1, wherein the spin torque enhancing layer is in contact with the capping layer and the free layer.

13. The apparatus of claim 1, wherein the magnetic tunneling junction device is integrated into at least one semiconductor die.

14. The apparatus of claim 1, further comprising a memory array that includes the magnetic tunneling junction device.

15. The apparatus of claim 14, further comprising a device, selected from a group consisting of a set top box, a music player, a video player, an entertainment unit, a navigation device, a communications device, a personal digital assistant (PDA), a fixed location data unit, and a computer, into which the memory array is integrated.

16. The apparatus of claim 4, wherein a first layer of the two ferromagnetic layers comprises CoFeB and wherein a second layer of two ferromagnetic layers comprises NiFe.

17. The apparatus of claim 16, wherein the second layer of the two ferromagnetic layers is between the spin torque enhancing layer and the first layer of the two ferromagnetic layers.

18. The apparatus of claim 10, further comprising:
a tunnel barrier adjacent to the free layer, wherein the spin torque enhancing layer is between the free layer and an electrical contact of the magnetic tunneling junction device; and
a pinned layer, wherein the tunnel barrier layer is between the free layer and the pinned layer.

19. The apparatus of claim 18, wherein the pinned layer comprises a composite layer of two ferromagnetic layers sandwiching a non-magnetic spacer layer.

20. The apparatus of claim 19, wherein a first ferromagnetic layer of the two ferromagnetic layers comprises CoFe, and wherein a second layer of the two ferromagnetic layers comprises CoFeB.

21. The apparatus of claim 20, wherein the second ferromagnetic layer is between the non-magnetic spacer layer and the tunnel barrier layer.

22. The apparatus of claim 20, wherein the non-magnetic spacer layer comprises ruthenium (Ru).

23. The apparatus of claim 19, wherein the free layer is a composite layer comprising a first ferromagnetic portion and a second ferromagnetic portion.

24. The apparatus of claim 23, wherein the first ferromagnetic portion comprises cobalt (Co) and iron (Fe), and wherein the second ferromagnetic portion comprises nickel (Ni) and iron (Fe).

25. The apparatus of claim 8, wherein the insulating material comprises an oxide of magnesium (Mg).

26. The apparatus of claim 25, wherein the insulating material further comprises an oxide of at least one material selected from a group consisting of aluminum (Al), boron (B), silicon (Si), germanium (GO, tungsten (W), Niobium (Nb), molybdenum (Mo), tantalum (Ta), vanadium (V), titanium (Ti), chromium (Cr), iron (Fe), cobalt (Co), nickel (Ni), and copper (Cu).

27. The apparatus of claim 8, wherein the insulating material comprises a nitride of platinum (Pt).

28. The apparatus of claim 27, wherein the conductive island and the conductive path comprise one or more materials selected from a group consisting of copper (Cu), silver (Ag), gold (Au), platinum (Pt), palladium (Pd), iridium (Ir), Osmium (Os), chromium (Cr), tantalum (Ta), titanium (Ti), silicon (Si), aluminum (Al), nickel (Ni), iron (Fe), and cobalt (Co).

29. The apparatus of claim 27, wherein the insulating material further comprises a nitride of materials selected from a group consisting of aluminum (Al), boron (B), silicon (Si), germanium (Ge), titanium (Ti), and platinum (Pt).

30. The apparatus of claim 1, wherein the spin torque enhancing layer is between the free layer and the capping layer.

31. The apparatus of claim 30, wherein the capping layer is between the spin torque enhancing layer and an electrical contact of the magnetic tunneling junction device.

32. The apparatus of claim 30, wherein the spin torque enhancing layer comprises at least one of a conductive island extending through the spin torque enhancing layer and a conductive path extending through the spin torque enhancing layer.

33. The apparatus of claim 32, wherein the conductive island and the conductive path are surrounded by insulating material.

34. The apparatus of claim 33, wherein the insulating material comprises at least one of:
an oxide of materials selected from a group consisting of magnesium (Mg), aluminum (Al), boron (B), silicon (Si), germanium (Ge), tungsten (W), Niobium (Nb), molybdenum (Mo), tantalum (Ta), vanadium (V), titanium (Ti), chromium (Cr), iron (Fe), cobalt (Co), nickel (Ni), and copper (Cu);

a nitride of materials selected from a group consisting of aluminum (Al), boron (B), silicon (Si), germanium (Ge), titanium (Ti), and platinum (Pt);

at least one material selected from a group consisting of silicon (Si), germanium (Ge), gallium (Ga), cadmium (Cd), Tellurium (Te), antimony (Sb), indium (In), aluminum (Al), arsenic (As), mercury (Hg), carbon (C), and Chromium (Cr); and a half-metallic material.

35. The apparatus of claim 33, wherein the insulating material comprises a half-metallic material including one of $Sr_2FeMoO_6$, $(La_{0.7}Sr_{0.3})MnO_3$, NiMnSb, $Fe_3O_4$, and $CrO_2$.

36. The apparatus of claim 8, wherein a first size of a particular conductive island of the one or more conductive islands is a different size than a second size of a particular conductive path of the one or more conductive paths.

37. The apparatus of claim 8, wherein the insulating material is included in an insulating layer of the spin torque enhancing layer, wherein the insulating layer includes conductive material added therein, and wherein the conducive material added therein causes a resistance of the insulating layer to be less than a resistance of an equivalent insulating layer including only the insulating material.

38. The apparatus of claim 8, wherein the one or more conductive paths include conductive material added to the spin torque enhancing layer.

39. An apparatus comprising:
a magnetic tunneling junction device comprising:
a free layer;
a tunnel barrier layer adjacent to the free layer;
a spin torque enhancing layer adjacent to the free layer, wherein the spin torque enhancing layer comprises a non-magnetic metal alloy and a nano-oxide layer, and wherein the spin torque enhancing layer is between the free layer and an electrical contact of the magnetic tunneling junction device; and
a capping layer adjacent to the spin torque enhancing layer.

40. The apparatus of claim 39, further comprising a pinned layer adjacent to the tunnel barrier layer.

41. The apparatus of claim 39, wherein the spin torque enhancing layer is in contact with the capping layer and the free layer, and wherein the capping layer is in contact with an electrode.

42. The apparatus of claim 39, wherein the spin torque enhancing layer reduces a critical switching current density threshold without substantially increasing a resistance of the magnetic tunneling junction device.

43. An apparatus comprising:
a magnetic tunnel junction device including:
means for storing a data value as an orientation of a magnetic moment that is programmable by a spin polarized current exceeding a threshold current density;
tunneling barrier means for providing conduction electrons to the means for storing by quantum mechanical tunneling of the conduction electrons through a barrier;
spin torque enhancing means for reducing a critical switching current density threshold without substantially decreasing a tunneling magnetoresistance (TMR) of the magnetic tunnel junction device, wherein the spin torque enhancing means includes a non-magnetic metal alloy and a nano-oxide layer, and wherein the means for storing is positioned between the tunneling barrier means and the spin torque enhancing means; and
capping means for protecting the magnetic tunnel junction device, wherein the capping means is adjacent to the spin torque enhancing means.

44. The apparatus of claim 43, wherein the nano-oxide layer includes an oxidation layer of a non-magnetic metal alloy.

45. The apparatus of claim 43, wherein the magnetic tunnel junction device is integrated in at least one semiconductor die.

46. The apparatus of claim 43, further comprising a memory array that includes the magnetic tunnel junction device including the means for storing, the tunneling barrier means, and the spin torque enhancing means.

47. The apparatus of claim 46, further comprising a device selected from a group consisting of a set top box, a music player, a video player, an entertainment unit, a navigation device, a communications device, a personal digital assistant (PDA), a fixed location data unit, and a computer, into which the memory array is integrated.

48. An apparatus comprising:
a magnetic tunneling junction device comprising:
a free layer;
a spin torque enhancing layer responsive to the free layer, wherein the spin torque enhancing layer comprises a non-magnetic aluminum copper $Al_{90}Cu_{10}$ alloy and a nano-oxide layer; and
a capping layer adjacent to the spin torque enhancing layer.

49. An apparatus comprising:
a magnetic tunneling junction device comprising:
a free layer;
a spin torque enhancing layer responsive to the free layer, wherein the spin torque enhancing layer comprises a nano-oxide layer and a conductive path extending through the spin torque enhancing layer, and wherein the nano-oxide layer comprises an oxidation layer of magnesium (Mg); and
a capping layer adjacent to the spin torque enhancing layer.

50. An apparatus comprising:
a magnetic tunneling junction device comprising:
a free layer;
a spin torque enhancing layer responsive to the free layer, wherein the spin torque enhancing layer comprises:
a nano-oxide layer; and
at least one of a conductive island extending through the spin torque enhancing layer and a conductive path extending through the spin torque enhancing layer, wherein the conductive island and the conductive path comprise a non-magnetic metal alloy; and
a capping layer adjacent to the spin torque enhancing layer.

51. An apparatus comprising:
a magnetic tunneling junction device comprising:
a free layer; and
a spin torque enhancing layer responsive to the free layer, wherein the spin torque enhancing layer comprises:
a nano-oxide layer; and
at least one of a conductive island extending through the spin torque enhancing layer and a conductive path extending through the spin torque enhancing layer, wherein the conductive island and the conductive path comprise magnesium (Mg); and
a capping layer adjacent to the spin torque enhancing layer.

52. The apparatus of claim 51, wherein the conductive island and the conductive path comprise one or more materials selected from a group consisting of copper (Cu), silver (Ag), gold (Au), platinum (Pt), palladium (Pd), iridium (Ir), Osmium (Os), chromium (Cr), tantalum (Ta), titanium (Ti), silicon (Si), aluminum (Al), nickel (Ni), iron (Fe), and cobalt (Co).

* * * * *